United States Patent
Nakai et al.

(10) Patent No.: US 7,397,695 B2
(45) Date of Patent: Jul. 8, 2008

(54) SEMICONDUCTOR MEMORY APPARATUS AND METHOD FOR WRITING IN THE MEMORY

(75) Inventors: Kiyoshi Nakai, Tokyo (JP); Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 254 days.

(21) Appl. No.: 11/409,097

(22) Filed: Apr. 24, 2006

(65) Prior Publication Data
US 2006/0250863 A1 Nov. 9, 2006

(30) Foreign Application Priority Data
Apr. 25, 2005 (JP) .............................. 2005-126456

(51) Int. Cl.
*G11C 7/00* (2006.01)
(52) U.S. Cl. ...................................... 365/163; 365/148
(58) Field of Classification Search ................. 365/163, 365/148, 210.1
See application file for complete search history.

(56) References Cited

U.S. PATENT DOCUMENTS 6,879,513 B2 * 4/2005 Ooishi ......................... 365/158
6,954,385 B2 * 10/2005 Casper et al. ........... 365/189.07

FOREIGN PATENT DOCUMENTS

JP 2001-210073 8/2001

OTHER PUBLICATIONS

Woo Yeong Cho, et al. "A 1.18 μm 3.0V 64Mb Non-Volatile Phase-Transition Random-Access Memory (PRAM)", 2004 IEEE International Solid-State Circuits Conference (ISSCC 2004/Session 2/Non-Volatile Memory/2.1, Feb. 16, 2004.

* cited by examiner

*Primary Examiner*—Vu A Le
(74) *Attorney, Agent, or Firm*—McGinn IP Law Group, PLLC

(57) ABSTRACT

A phase change memory of high compatibility with DRAM. If a cell MC0, connected to a word line WL0L, is of a low resistance, current flowing through it is higher than that flowing in a dummy cell MR0, and hence a bit line SA_B is at a potential lower than that of a bit line SA_T. This difference is amplified by a sense amplifier SA and read out. Immediately before latching cell data by the sense amplifier, an NMOS transistor MN1 is turned off to disconnect a memory cell part from a sense amplifier part. An NMOS transistor MN10 then is turned on so that data on the selected word line are all in the set state. If then writing is to be carried out, writing is carried out in the sense amplifier SA from signal lines LIO and RIO, which are I/O lines. However, writing is not performed in the memory cells. Before a precharge command is entered to precharge the word line WL0L, under, the NMOS transistor MN1 is again turned on to write reset in the cell MC0.

17 Claims, 8 Drawing Sheets

SEMICONDUCTOR MEMORY APPARATUS AND METHOD FOR WRITING IN THE MEMORY

FIELD OF THE INVENTION

This invention relates to a semiconductor memory apparatus and a writing method therefor. More particularly, this invention relates to a semiconductor memory apparatus employing a memory provided with a programmable resistor device, and a write method therefor.

BACKGROUND OF THE INVENTION

A phase change memory, as typical of a memory provided with a programmable resistor device, is formed of a chalcogenide material, such as Ge, Sb or Te, which undergoes transition between an amorphous state and a crystalline state on joule heating, these states being used as two logic states for storage. If the phase change caused in the phase change memory by joule heating is to be from the low resistance state (set state) to the high resistance state (reset state), a high current is caused to flow for short time. For reverse transition, that is, for transition from the high resistance state (reset state) to the low resistance state (set state), it is necessary to cause a relatively low current to flow for longer time, usually for tens of ns to about 100 ns. For example Non-Patent Document 1 shows the configuration of a 64 Mb RAM employing a phase change memory in which the set time, that is the time needed for setting up the low resistance state, and the reset time, that is the time needed for setting up the high resistance state, are 120 ns and of the order of 50 ns, respectively.

The phase change memory may be read out within a time comparable to that of a DRAM. On the other hand, the time for transition from the high resistance state (reset state) to the low resistance state (set state) is longer, being from tens of ns to approximately 100 ns. For this reason, the phase change memory is intended to be used in many cases in combination with an asynchronous SRAM or a flash memory having a longer cycle time.

FIG. 6 depicts a timing chart for writing for the case of using a phase change memory in combination with a memory having an asynchronous SRAM interface. In FIG. 6, a word line is taken high responsive to address transition. A column selection line is activated simultaneously. When the column selection line is activated, data writing is commenced. The data writing comes to a close responsive to address transition of the next cycle. When the write cycle tWC is 70 ns, the write time can be performed until shortly after the start of the next cycle. Hence, tW=50 ns or thereabouts can be secured as an actual write time. In this manner, in case the write time of the phase change memory tWR=45 ns, it may be presumed to be possible to implement an SRAM-compatible non-volatile memory.

As a related technique, these is shown in Patent Document 1 a non-volatile semiconductor memory apparatus having memory cells capable of holding data as volatile data and non-volatile data. The memory cells capable of holding data as volatile data and non-volatile data may be the combination of, for example, cells of a DRAM, as volatile data memory means, and cells of an EEPROM, as non-volatile data memory means, or may also be cells having the functions of both volatile memory cells and non-volatile memory cells, through the use of a ferroelectric material. In this memory apparatus, when a start signal for starting a readout cycle for reading out data from a memory cell or a start signal for starting a write cycle for writing data in a memory cell is entered, a column address decision circuit verifies whether the row address (word line address) as entered for the directly previous readout/write cycle is the same as that entered for the current readout/write cycle. In case the row address of the directly previous readout/write cycle is different from that of the current readout/write cycle, volatile data is stored as non-volatile data in the memory cell as selected with the row address of the directly previous cycle, by way of a store operation. Subsequently, the non-volatile data, stored in the memory cell, as selected by the row address of the current cycle, is converted into volatile data, in order to read out the non-volatile data, by way of a recall operation. The so obtained volatile data is stored in the memory cell, in the sense amplifier connected to the relevant column address, and in, for example, a latch circuit other than the sense amplifier.

[Non-Patent Document 1]
   Woo Yeong Cho et al., 'A 0.18 µm 3.0 V 64 Mb Non-Volatile Phase-Transition Random-Access Memory (PRAM)', 2004 IEEE International Solid-State Circuits Conference (ISSCC 2004/SESSION 2/NON-VOLATILE MEMORY/2.1, Feb. 16, 2004

[Patent Document 1]
   Japanese Patent Kokai Publication No. JP-P2001-210073A

SUMMARY OF THE DISCLOSURE

If it is attempted to implement a memory apparatus composed of this phase change device, having the specifications for compatibility with a synchronous DRAM (SDRAM), there is presented the following problem which is yet to be solved.

In a DRAM, data is written in a sense amplifier within one cycle time, and is then written by the sense amplifier in a memory cell. Data may also be written in the same manner consecutively to the same bit. That is, if data in the sense amplifier is rewritten in a cycle, the data is automatically written by the sense amplifier in the cells within one cycle. That is, data D0, D1, D2 and D3 may be written in succession, as shown in FIG. 7.

However, if it is attempted to write data in a phase change device in a similar manner, the following problem is presented. With a phase change memory, data storage is by transition between the set (low resistance) state and the reset (high resistance) state, depending on the amounts of the current caused to flow through a phase change device. The write operation for a memory cell must be carried out for a preset time, in a manner different from the case of a DRAM in which it is sufficient that data is written by the sense amplifier for a time interval longer than a preset time interval.

If the writing in a phase change device is reset writing (writing of transition from the high resistance state to the low resistance state), a high voltage is applied for a short time and a high current is caused to flow through the phase change device to generate an amorphous state. If, in contrast, the writing in the phase change device is set writing (writing of transition from the low resistance state to the high resistance state), a voltage lower than the reset write voltage is applied for a longer time to set the phase change device in the re-crystalline state. There is an optimum time duration for each of the write time durations, such that, if the write time is shorter or longer than the optimum time duration, the phase change device cannot be controlled to desired resistance values. Moreover, in order to effect such writing, the writing in the cell itself must be completed within a preset time.

However, if the configuration compatible with the DRAM is to be implemented, writing in a random column address can be coped with only by adjusting the write time based on the activation time of the column select line. It is apparent that ultimately the write cycle time cannot be less than the actual write time in the memory cell. For example if tWR (reset)=15 ns and tWR (set)=45 ns, the write cycle time is limited by tWR (set)=45 ns, such that it is not possible to further expedite the write cycle.

Hence, if it is attempted to prepare a DRAM-interface compatible apparatus, such as MobileRAM, by a memory employing a phase change device, it is difficult to maintain the targeted compatibility because of constraints in the write time.

It is therefore an object of the present invention to provide a writing method for a semiconductor memory apparatus, comprising a phase change memory, in which the write time is rendered scarcely visible from outside, so that the phase change memory with the so shortened write cycle is made compatible with a DRAM, and a semiconductor memory apparatus on which the method is to be carried out. Other objects will become apparent from the entire disclosure.

According to the present invention there is provided, in its one aspect, a method for writing in a semiconductor memory apparatus in which writing is made in a plurality of memory cells of the semiconductor memory apparatus provided at intersections of bit lines and word lines, the memory cells each including a programmable resistor device. The method comprises a step of reading out signals corresponding to resistance values of the memory cells connected to a selected word line, and holding the read out signals in associated sense amplifiers, a step of writing the memory cell or cells to a first state, and a step of writing only necessary memory cell or cells to a second state.

In the method for writing, in a first embodiment, the step of writing to the first state may be carried out in a lump or by a plurality of number of times in succession.

In the method for writing, in a second embodiment, the step of writing to the second state may be carried out at the time of pre-charging of the selected word line.

In the method for writing, in a third embodiment, the step of writing in memory cells connected to the activated word line may be carried out in a lump, or writing may be carried out in the memory cells connected to the sense amplifiers to which data for writing have been transferred.

The present invention also provides, in its one aspect, a semiconductor memory apparatus comprising a plurality of memory cells provided at intersections between bit lines and word lines, each memory cell including a programmable resistor device, a plurality of sense amplifiers for reading out and holding signals corresponding to resistance values of the memory cells connected to a selected word line, and a write controller for performing control so that writing is carried out in the memory cell or cells to a first state and so that writing is carried out only to necessary memory cell or cells to a second state.

In the semiconductor memory apparatus, in a first embodiment, each memory cell may include a memory cell transistor and a programmable resistor device, the memory cell transistor and the programmable resistor device being connected in series across the bit line and the first power supply. The memory cell transistor may include a control terminal connected to the word line.

In the semiconductor memory apparatus, in a second embodiment, a transistor may be provided between each bit line and a preset power supply for writing the memory cells to the first state or to the second state.

In the semiconductor memory apparatus, in a third embodiment, the resistance value of the resistor device in the first state may be higher than that of the resistor device in the second state.

In the semiconductor memory apparatus, in a fourth embodiment, the resistance value of the resistor device in the first state may be lower than that of the resistor device in the second state.

In the semiconductor memory apparatus, in a fifth embodiment, the resistor device preferably contains a material which undergoes phase transition between the first and second states.

In the semiconductor memory apparatus, in a sixth embodiment, the resistor device may be programmed so that it is in a crystalline state and in an amorphous state in the first state and in the second state, respectively.

In the semiconductor memory apparatus, in a seventh embodiment, the resistor device may be programmed so that it is in an amorphous state and in a crystalline state in the first state and in the second state, respectively.

The meritorious effects of the present invention are summarized as follows.

According to the present invention, a semiconductor memory apparatus, highly compatible with a DRAM, may be implemented by hiding the write time in the phase change memory in a time interval between an active command and a precharge command (tRAS).

PREFERRED EMBODIMENTS OF THE INVENTION

A semiconductor memory apparatus according to an embodiment of the present invention stores data in a memory cell comprised of a phase change device. After transferring data from a memory cell, connected to a selected word line, to a sense amplifier, the set state is written once in the memory cells connecting to the word line. For example, the memory cells are written to a low resistance state. Subsequently, write data is written only in the sense amplifier, whereas it is not written in the memory cells. Before a precharge command is entered and the word line is taken low, reset writing is carried out only for a memory cell or cells in which to write reset data. For example, this memory cell is set to a high resistance state.

With this write method, a DRAM-compatible memory may be implemented as high-speed consecutive writing is achieved as in the RAM, and as set writing, which is in need of a longer write time, is hidden in a time interval between an active command and a pre-charge command (tRAS).

First Embodiment

Figure 1:
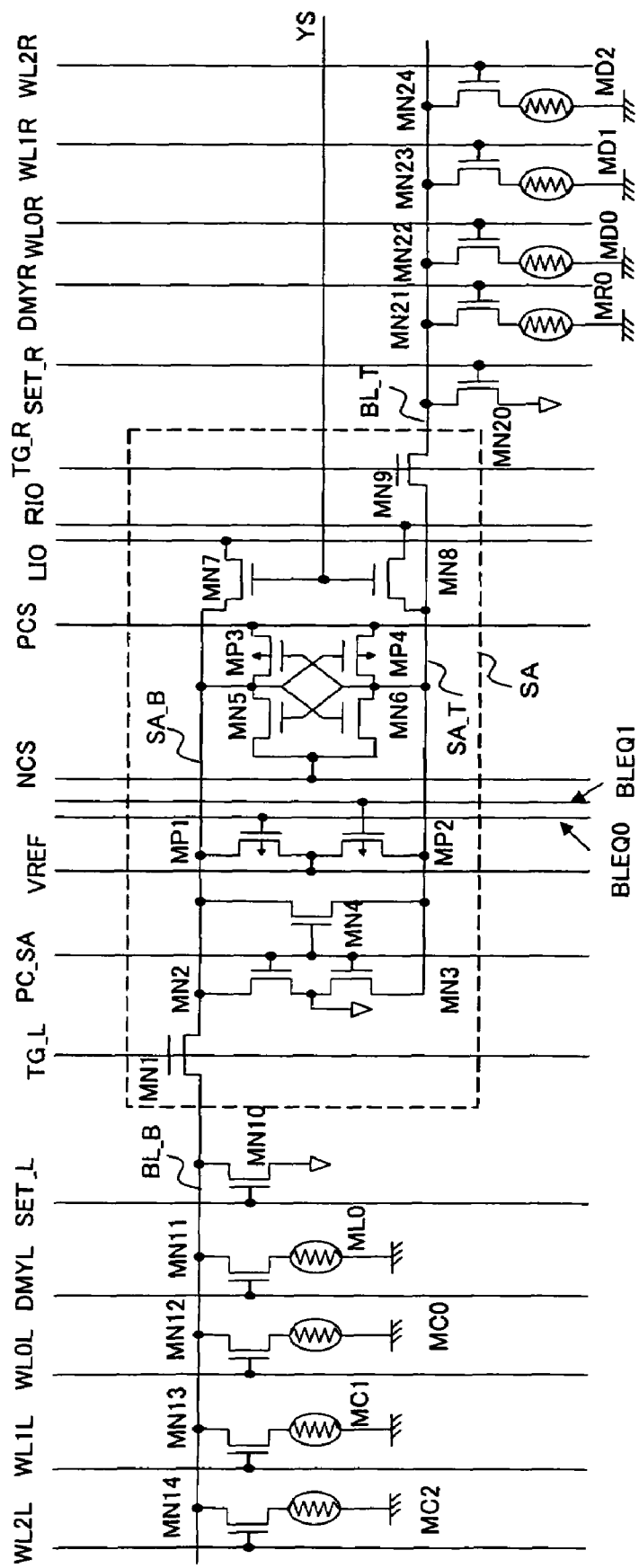
FIG. 1 is a circuit diagram showing the configuration of a sense amplifier part and a memory cell part of a semiconductor memory apparatus according to an embodiment of the present invention.

FIG. 1 depicts a circuit diagram showing the configuration of a sense amplifier part and a memory cell part of a semiconductor memory apparatus according to an embodiment of the present invention. A sense amplifier SA includes NMOS transistors MN1 to MN9 and PMOS transistors MP1 to MP4. The memory cell part includes NMOS transistors MN10 to MN14 and MN20 to MN24, and cells ML0, MC0 to MC2, MR0, and MD0 to MD2, each including a phase change device.

The NMOS transistor MN2 has one end connected to a bit line SA_B in the sense amplifier SA, while having the other end connected to a power supply VSS. The NMOS transistor MN3 has one end connected to a bit line SA_T in the sense amplifier SA, while having the other end connected to the power supply VSS. The NMOS transistor MN4 has one end connected to a bit line SA_B, while having the other end connected to the bit line SA_T. The gates of the NMOS transistors MN2, MN3 and MN4 are connected to a signal line PC_SA. When a high level pre-charge signal is supplied to the signal line PC_SA, the NMOS transistors MN2, MN3 and MN4 are turned on to pre-charge the bit lines SA_B and SA_T to VSS.

The PMOS transistor MP1 has one end connected to the bit line SA_B, while having the other end connected to a signal line VREF and having a gate connected to a signal line BLEQ0. The PMOS transistor MP2 has one end connected to the bit line SA_T, while having the other end connected to the signal line VREF and having a gate connected to the signal line BLEQ1. When the signal lines BLEQ0, MLEQ1 are taken high, the PMOS transistors MP1, MP2 are turned on to pre-charge the bit line SA_B and SA_T to VREF.

The NMOS transistors MN5, MN6 are cross-connected to each other to form a latch circuit to amplify the potential difference across the bit lines SA_B and SA_T to output the resulting amplified signal to a signal line NCS. The PMOS transistors MP3, MP4 are also cross-connected to each other to form a latch circuit to amplify the potential difference across the bit lines SA_B and SA_T to output the resulting amplified signal to a signal line PCS.

The NMOS transistor MN7 has one end connected to the bit line SA_B, while having the other end connected to a signal line LIO, as an I/O line, and having a gate connected to a signal line YS. The NMOS transistor MN8 has one end connected to the bit line SA_T, while having the other end connected to a signal line RIO, as I/O line, and having a gate connected to the signal line YS. When the signal line YS goes high, the bit line SA_B is connected to the signal line LIO, while the bit line SA_T is connected to the signal line RIO.

The NMOS transistor MN1, also termed a shared MOS, has one end connected to the bit line SA_B, while having the other end connected to the bit line BL_B, outside of the sense amplifier SA, and having a gate connected to the signal line TG_L. When the signal line TG_L is taken high, the bit line SA_B is short-circuited to the bit line BL_B.

The NMOS transistor MN9, also termed a shared MOS, has one end connected to the bit line SA_T, while having the other end connected to the bit line BL_T, outside of the sense amplifier SA, and having a gate connected to the signal line TG_L. When the signal line TG_R is taken high, the bit line SA_T is short-circuited to the bit line BL_T.

The cells ML0 and MC0 to MC2 have one ends grounded, while having the other ends connected via NMOS transistors MN11 to MN14 to the bit line BL_B. The gates of the NMOS transistors MN11 to MN14 are connected to word lines DMYL, WL0L, WL1L and WL2L, so that, when the word lines are taken high, the cells associated therewith are connected to the bit line BL_B.

The NMOS transistor MN10 has one end connected to the bit line BL_B, while having the other end connected to VSS and having a gate connected to the signal line SET_L. When the signal line SET_L goes high, VSS is supplied to the bit line BL_B. The NMOS transistor MN10 operates for SET writing for phase change devices.

The cells MR0 and MD0 to MD2 have one ends grounded, while having the other ends connected via NMOS transistors MN21 to MN24 to the bit line BL_T. The gates of the NMOS transistors MN21 to MN24 are connected to word lines DMYR, WL0R, WL1R and WL2R, so that, when the word lines are taken high, the cells associated therewith are connected to the bit line BL_T.

The NMOS transistor MN20 has one end connected to the bit line BL_T, while having the other end connected to VSS and having a gate connected to the signal line SET_R. When the signal line SET_R is taken high, VSS is supplied to the bit line BL_T. The NMOS transistor MN20 operates for SET writing for the phase change device.

Figure 2:
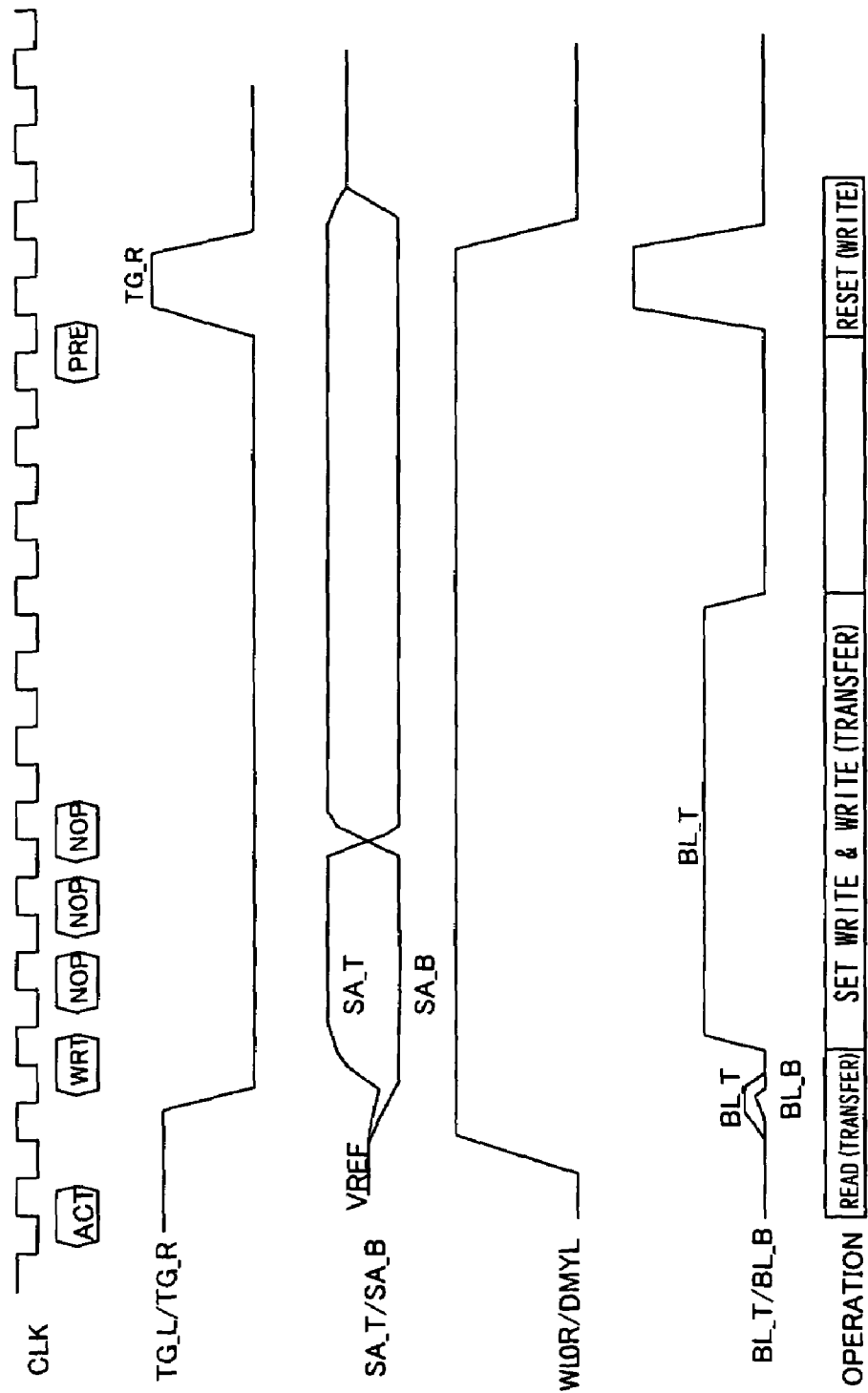
FIG. 2 is a timing chart showing a signal waveform in a sense amplifier part and a memory cell part of a semiconductor memory apparatus embodying the present invention.

The operation of the circuit shown in FIG. 1 will be explained. FIG. 2 depicts a timing chart showing signal waveforms of various parts in the circuit of FIG. 1.

Initially, bit lines are pre-charged to VSS. When a mat is selected, the signal line PC_SA for pre-charging is taken low. Simultaneously, the signal lines BLEQ0, BLEQ1 are controlled, that is, taken high, to pre-charge the bit lines to a voltage VREF. This voltage VREF is lower than the set write potential.

It is assumed that a word line WL0L has been selected. Simultaneously, the word line DMYR of the mat lying on the opposite side of the selected word line with respect to the sense amplifier is taken high. The cell MR0, connected to the word line DMYR, is a dummy cell, that is, a cell having a resistance state which is intermediate between the high resistance state and the low resistance state.

In case the cell MC0, connected to the word line WL0L, is at a low resistance, the current flowing through the cell MC0 is higher than the current flowing through the dummy cell MR0. Hence, the bit line SA_B is at a potential lower than that of the bit line SA_T. This difference is amplified by the sense amplifier SA and read out. That is, when a word line is activated and a memory cell is selected, the resistance value of the selected cell is compared to that of the dummy cell, and the result of comparison is latched by the sense amplifier SA. It is noted that the NMOS transistor MN1 is turned off, directly before latching the cell data by the sense amplifier, to disconnect the memory part and the sense amplifier part from each other.

The NMOS transistor MN10 for set writing on the selected side is then turned on, so that data on the selected word line are all in the set state. If writing is then carried out, the write operation is carried out in the sense amplifier from the signal lines LIO, RIO, operating as I/O lines. That is, the write operation is performed only in the sense amplifier, while no write operation is performed in the memory cells.

Before a pre-charge command is entered to pre-charge the word line WL0L, the NMOS transistor MN1 is again turned on to carry out reset writing. If it is set data that has been written in the sense amplifier, the bit line SA_B is at the VSS level, and hence the source of the phase change device is at the same potential as the bit lines. Consequently, writing is not carried out and only reset writing is carried out selectively. The reset write time is controlled by setting the gate of the NMOS transistor MN1 to a high level state during the time which allows for reset writing in the gate of the NMOS transistor MN1.

Figure 3:
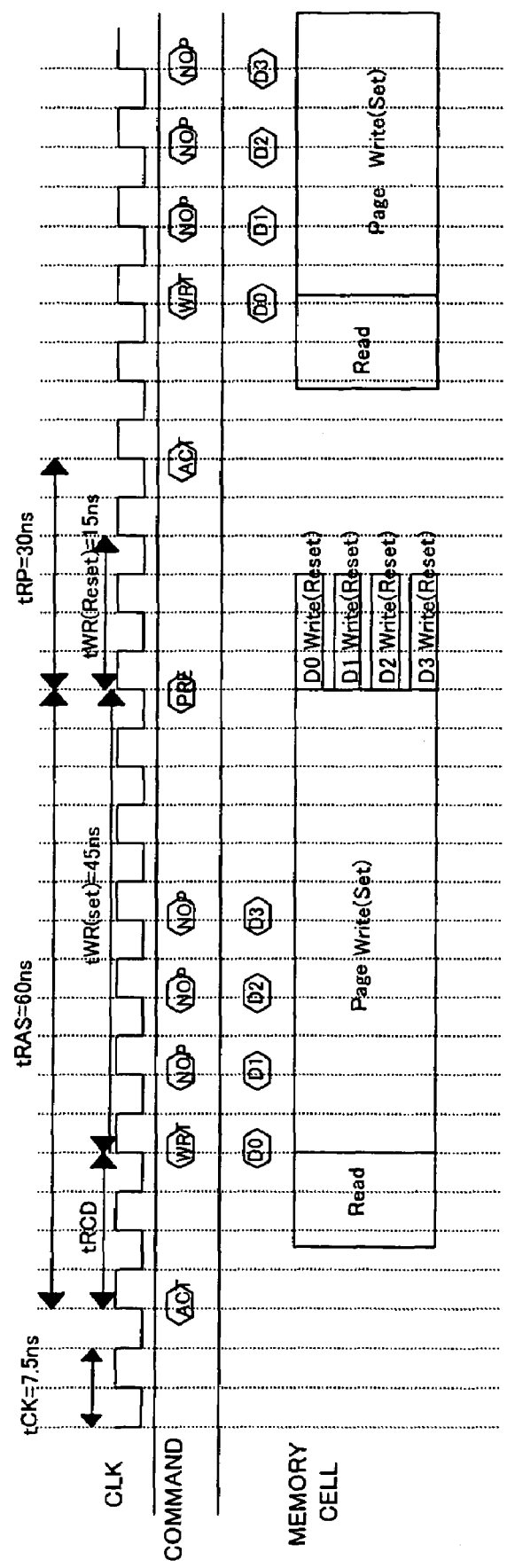
FIG. 3 is a timing chart for writing in the semiconductor memory apparatus embodying the present invention.
Figure 4:
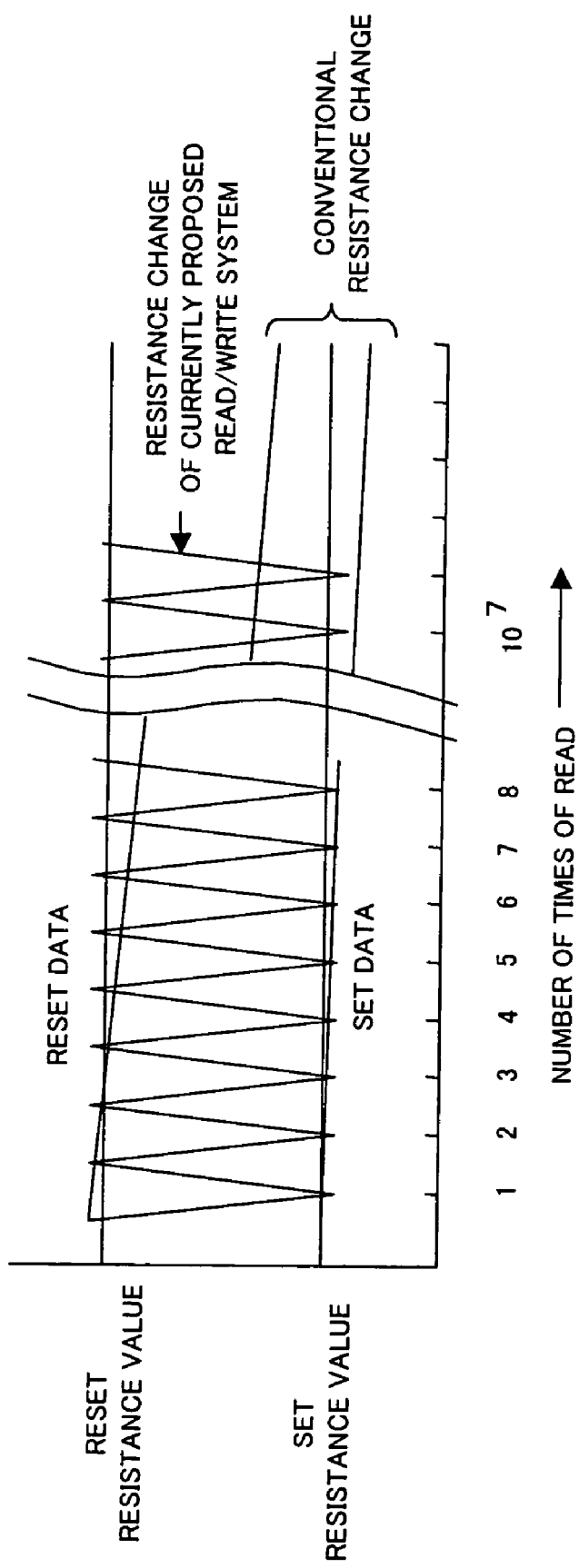
FIG. 4 is a graph showing changes in the resistance value of the phase change device.
Figure 5:
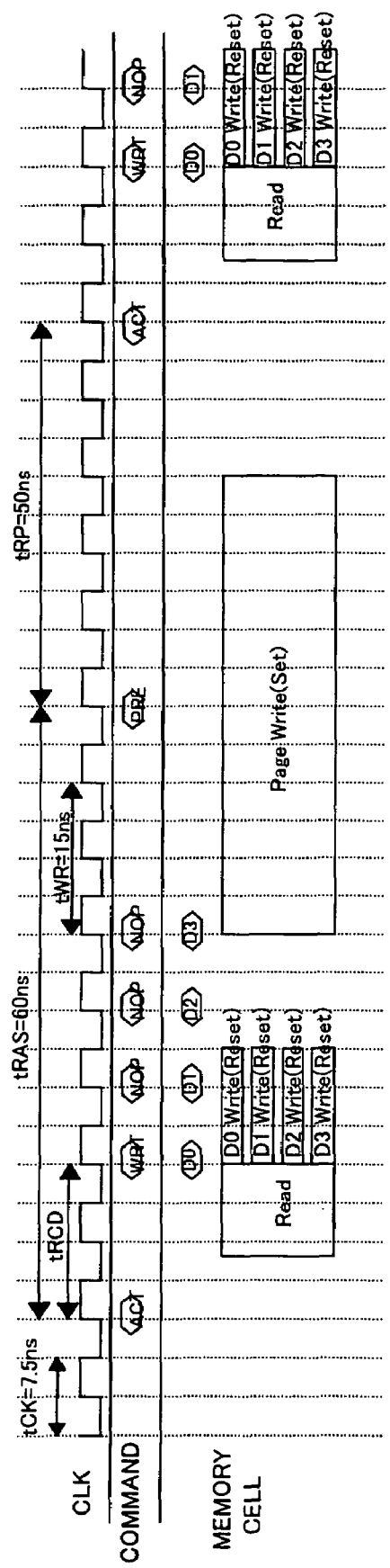
FIG. 5 is a timing chart for writing in a conventional DRAM.
Figure 6:
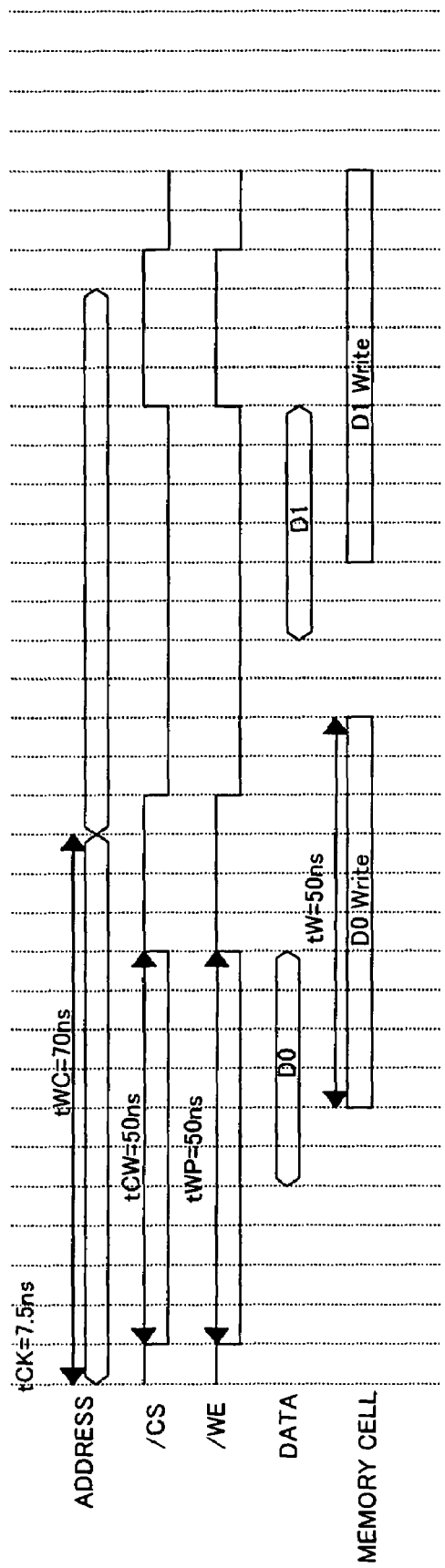
FIG. 6 is a timing chart for writing for state-of-the-art combination of the phase change memory apparatus with a memory having an asynchronous SRAM interface.
Figure 7:
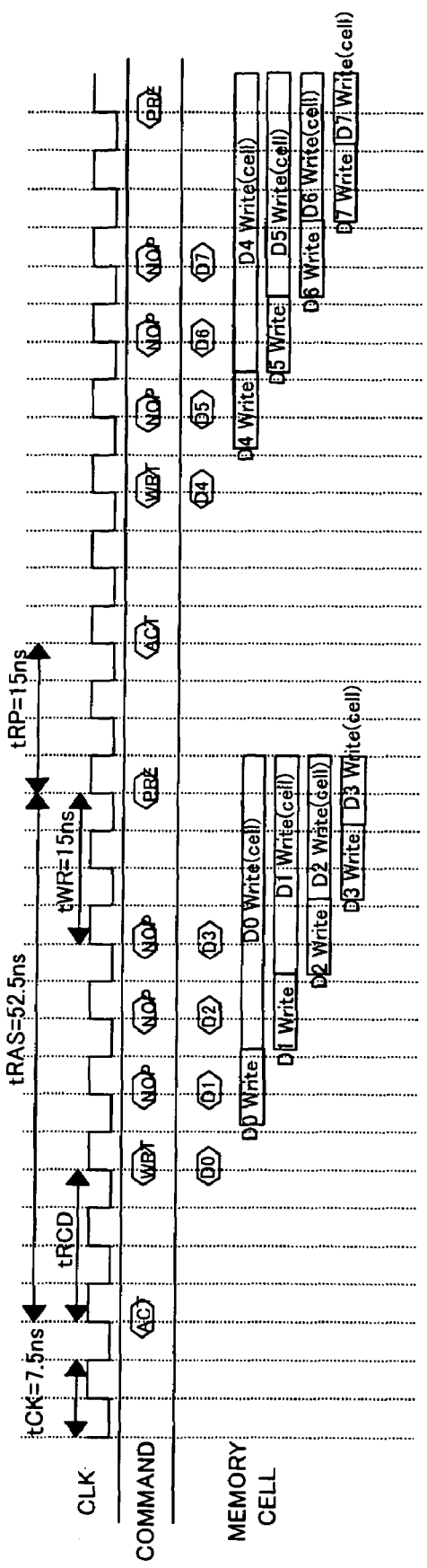
FIG. 7 is a timing chart for writing in a conventional DRAM.
Figure 8:
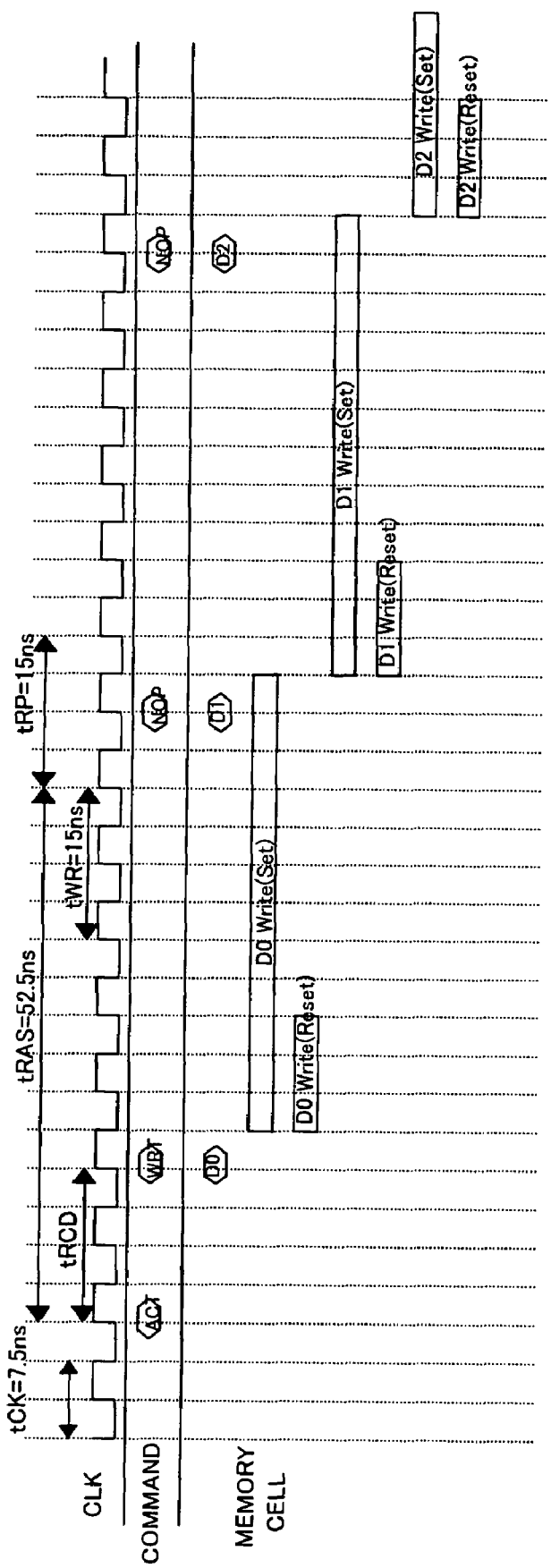
FIG. 8 is a timing chart for writing for state-of-the-art combination of the phase change memory apparatus with a memory having a DRAM interface.

FIG. 3 depicts a timing chart for writing in the embodiment of the present invention. It is assumed that tWR (Reset), that is, reset write time, is 15 ns and tWR (Set), that is, set write time, is 45 ns. In this case, data is transmitted to the sense amplifier within the period of tRCD as from entry of an ACT command. Then, all of bits activated simultaneously are written to the set state (page write). In this case, tRAS is tRCD+ tWR (Set), such that, with tRCD=15 ns, it is sufficient if the tRAS time interval is 60 ns or longer. FIG. 3 shows the operation for the burst length BL of an SDRAM equal to 4, and hence the time per word is 22.5 ns which is longer than 15 ns of the inherent value of specification for tWR of a DRAM. However, this is not visible from outside in case one cycle of a read or write operation is entered.

When a PRE command is then entered, reset writing with a shorter write time is carried out by a lumped operation. Since tWR (Reset) assumed is 15 ns, tRP is extended in this case by 15 ns to amount to 30 ns. However, the extension of this order is small and hence does not matter.

With the semiconductor memory apparatus, carrying out the write operation as described above, it is possible to provide a non-volatil memory for executing read/write in accordance with the specification conforming to the DRAM. It is noted that the write method described above has another merit, in addition to the merit that a write cycle may be made shorter and that the somewhat time-consuming set writing, may be hidden in the tRAS period. This other merit will now be described.

For writing in the phase change memory, joule heating is carried out by causing the current to flow through a device to control the crystallization/amorphization. Hence, it is feared that heat is generated in the phase change device portion, even with the current flowing during the read operation, thereby causing changes in the state. In particular, it is feared that, if the read operation is repeated for cells in the reset (amorphous) state, the resistance value is lowered, as crystallization progresses gradually, or that the resistance value in the low resistance state is excessively lowered, such that a high resistance state cannot be set unless an excessively high current is supplied.

This concern may be removed by using a material of a composition strong in retention (holding characteristics) or by reducing the current caused to flow during read time. However, the material showing strong thermal retention characteristics is high in the melting point, so that, if this material is used, the rewrite current/time is increased. Moreover, if the read current is limited, read time is increased to render the memory device unsuitable for use with a RAM.

However, with the use of the writing method of the present embodiment, rewriting is carried out each time a word line is activated, irrespective of whether the word line activation is for reading or for writing. Thus, the resistance value is restored to an initial value each time, thus eliminating the problem of lowering of the resistance value. Readout may be made without deterioration of the resistance value. Since the rewriting is made during readout, data may be read out destructively, so that the readout current may be increased to provide for high-speed readout.

In the foregoing description, the state following the readout is the low-resistance set state. This state following the readout may also be the high-resistance state (reset state). In this case, the relatively time-consuming set writing (page writing) is carried out during the pre-charge (PRE) cycle, thus protracting tRP. As described above, the state following the readout may be the high-resistance reset state in case highly random access is made and short tRAS is required, however, longer tRP is tolerated.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method for writing in a semiconductor memory apparatus in which writing is made in a plurality of memory cells of said semiconductor memory apparatus provided at intersections of bit lines and word lines, said memory cells each including a programmable resistor device, said method comprising:

a step of reading out signals corresponding to resistance values of the memory cells connected to a selected word line and holding the signals read out in associated sense amplifiers;

a step of writing said memory cell or cells to a first state; and a step of writing only necessary memory cell or cells to a second state.

2. The method for writing in a semiconductor memory apparatus according to claim 1 wherein said step of writing to said first state is carried out in a lump or by a plurality of number of times in succession.

3. The method for writing in a semiconductor memory apparatus according to claim 1 wherein said step of writing to said second state is carried out at the time of pre-charging of the selected word line.

4. The method for writing in a semiconductor memory apparatus according to claim 1 wherein writing in memory cells connected to the activated word line is carried out in a lump, or writing is carried out in the memory cells connected to the sense amplifiers to which data for writing have been transferred.

5. The method for writing in a semiconductor memory apparatus according to claim 1 wherein the resistance of said resistor device in said first state is higher than that of said resistor device in said second state.

6. The method for writing in a semiconductor memory apparatus according to claim 1 wherein the resistance of said resistor device in said first state is lower than that of said resistor device in said second state.

7. The method for writing in a semiconductor memory apparatus according to claim 1 wherein said resistor device contains a material subjected to phase change between the first and second states.

8. The method for writing in a semiconductor memory apparatus according to claim 7 wherein said resistor device is programmed so that said phase change material is in a crystalline state and in an amorphous state in said first state and in said second state, respectively.

9. The method for writing in a semiconductor memory apparatus according to claim 7 wherein said resistor device is programmed so that said phase change material is in an amorphous state and in a crystalline state in said first state and in said second state, respectively.

10. A semiconductor memory apparatus comprising:
- a plurality of memory cells provided at intersections between bit lines and word lines, each memory cell including a programmable resistor device;
- a plurality of sense amplifiers for reading out and holding signals corresponding to resistance values of the memory cells connected to a selected word line; and
- a write controller for performing control so that writing is carried out in said memory cell or cells to a first state and so that writing is carried out only to necessary memory cell or cells to a second state.

11. The semiconductor memory apparatus according to claim 10 wherein each memory cell includes a memory cell transistor and said programmable resistor device, said memory cell transistor and the programmable resistor device being connected in series across said bit line and said first power supply; and wherein
said memory cell transistor has a control terminal connected to said word line.

12. The semiconductor memory apparatus according to claim 10 further comprising:
a transistor provided between said bit lines and a preset power supply for writing said memory cell or cells to said first state or to said second state.

13. The semiconductor memory apparatus according to claim 10 wherein the resistance value of said resistor device in said first state is higher than that of said resistor device in said second state.

14. The semiconductor memory apparatus according to claim 10 wherein the resistance value of said resistor device in said first state is lower than that of said resistor device in said second state.

15. The semiconductor memory apparatus according to claim 10 wherein said resistor device contains a material which undergoes phase transition between said first and second states.

16. The semiconductor memory apparatus according to claim 15 wherein said resistor device is programmed so that it is in a crystalline state and in an amorphous state in said first state and in the second state, respectively.

17. The semiconductor memory apparatus according to claim 15 wherein said resistor device is programmed so that it is in an amorphous state and in a crystalline state in said first state and in the second state, respectively.

* * * * *